United States Patent
Ramond et al.

(10) Patent No.: US 9,627,893 B2
(45) Date of Patent: Apr. 18, 2017

(54) ELECTRONIC MANAGEMENT SYSTEM FOR ELECTRICITY GENERATING CELLS, ELECTRICITY GENERATING SYSTEM AND METHOD FOR ELECTRONICALLY MANAGING ENERGY FLOW

(71) Applicants: TOTAL MARKETING SERVICES, Puteaux (FR); CENTRE NATIONAL DE LA RECHERCHE SCIENTIFIQUE, Paris (FR)

(72) Inventors: Adrien Ramond, Graulhet (FR); Carlos Carrejo, Toulouse (FR); Youssef El Basri, Escatalens (FR); Corrine Alonso, Ramonville Saint Agne (FR); Bruno Estibals, Saint Thomas (FR); Lionel Seguier, Pins Justaret (FR)

(73) Assignees: Total Marketing Services, Puteaux (FR); Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 14/769,349

(22) PCT Filed: Feb. 20, 2014

(86) PCT No.: PCT/EP2014/053299
§ 371 (c)(1),
(2) Date: Aug. 20, 2015

(87) PCT Pub. No.: WO2014/128202
PCT Pub. Date: Aug. 28, 2014

(65) Prior Publication Data
US 2016/0006250 A1    Jan. 7, 2016

(30) Foreign Application Priority Data

Feb. 20, 2013    (EP) .................................... 13290035

(51) Int. Cl.
*H02J 3/38*        (2006.01)
*H01L 31/02*       (2006.01)

(52) U.S. Cl.
CPC ........ *H02J 3/383* (2013.01); *H01L 31/02021* (2013.01); *Y02E 10/50* (2013.01)

(58) Field of Classification Search
CPC ................................... H02J 3/383; H02J 1/12
(Continued)

(56) References Cited

U.S. PATENT DOCUMENTS

| 5,625,546 A * | 4/1997 | Schaal | H02J 3/46 307/58 |
| 8,564,990 B2 * | 10/2013 | Haderli | H02M 7/483 307/63 |

(Continued)

FOREIGN PATENT DOCUMENTS

| EP | 2 337 184 A2 | 6/2011 |
| EP | 2 518 885 A2 | 10/2012 |

(Continued)

OTHER PUBLICATIONS

International Search report dated Aug. 28, 2014 for PCT Application No. PCT/EP2014/053299; 4 pages.

(Continued)

*Primary Examiner* — Rexford Barnie
*Assistant Examiner* — Daniel Kessie
(74) *Attorney, Agent, or Firm* — Daly, Crowley, Mofford & Durkee, LLP (57) ABSTRACT

The invention relates to an electronic management system (5) for electricity generating cells (3), the system comprising:
cell connection terminals to be connected to n associated electricity generating cells (3), n being a positive integer number, (Continued)

outputs to be connected to m associated static converters (9); m being a positive integer number and at least m=2, an energy routing module (13) adapted for routing energy flows from and between said cell connection terminals towards said outputs; and an electronic control unit (15) adapted for controlling dynamically the energy routing module (13).

24 Claims, 9 Drawing Sheets

(58) Field of Classification Search
USPC .......................................................... 307/71
See application file for complete search history.

(56) References Cited

U.S. PATENT DOCUMENTS

| | | | |
|---|---|---|---|
| 8,837,098 B2* | 9/2014 | Victor | H01L 31/02021 361/42 |
| 2010/0109442 A1 | 5/2010 | Vega Betoret et al. | |
| 2010/0116325 A1* | 5/2010 | Nikoonahad | H01L 27/1421 136/251 |
| 2010/0250018 A1* | 9/2010 | Hauf | H02J 3/383 700/297 |
| 2011/0241431 A1* | 10/2011 | Chen | H02J 3/383 307/71 |
| 2013/0062956 A1* | 3/2013 | Meyer | H01L 31/02008 307/82 |
| 2013/0264870 A1* | 10/2013 | Keysar | H02J 1/00 307/24 |

FOREIGN PATENT DOCUMENTS

| | | |
|---|---|---|
| EP | 2 372 487 A3 | 1/2013 |
| FR | 2961035 | 9/2011 |
| WO | WO 2009/060273 A1 | 5/2009 |

OTHER PUBLICATIONS

Written Opinion of the International Searching Authority dated May 28, 2014 for PCT Application No. PCT/EP2014/053299; 7 pages.

Velasco-Quesada G. et al.; "Electrical PV Array Reconfiguration Strategy for Energy Extraction Improvement in Grid-Connected PV Systems;" IEEE Transactions on Industrial Electronics; vol. 56; No. 11; Nov. 1, 2009; pp. 4319-4331; 13 pages.

\* cited by examiner

ELECTRONIC MANAGEMENT SYSTEM FOR ELECTRICITY GENERATING CELLS, ELECTRICITY GENERATING SYSTEM AND METHOD FOR ELECTRONICALLY MANAGING ENERGY FLOW

CROSS REFERENCE TO RELATED APPLICATIONS

This application is a U.S. National Stage of PCT application PCT/EP2014/053299 filed in the English language on Feb. 20, 2014, and entitled "Electronic management system for electricity generating cells, electricity generating system and method for electronically managing energy flow," which claims priority to European application EP13290035.8 filed Feb. 20, 2013 which application is incorporated herein by reference.

FIELD OF THE INVENTION

The present invention relates to the field of electricity generating cells such as photovoltaic generators and more specifically to an electronic management system for electricity generating cells, an electricity generating system and a method for electronically managing energy flow.

BACKGROUND AND PRIOR ART

Standard photovoltaic installations comprise in general a centralized converter which has typically only one input channel able to perform individual Maximum Power Point Tracking (MPPT).

Photovoltaic modules are made of several strings of cells (for example 3 strings in a panel). A string of cells is the serial connection of several photovoltaic cells (for example 32 cells per string in one panel). These strings of cells are serial connected in the photovoltaic junction-box.

To each of these strings a by-pass diode can be associated in the photovoltaic junction box. These by-pass diodes arm to prevent damaging of photovoltaic cells when partial shadowing occurs (hot-spot). The photovoltaic modules are then serial connected to rise-up the voltage and match the nominal voltage of the central converter.

Several strings of modules can finally be parallel connected to match the nominal power of the central converter.

In this configuration, shading by chimneys, trees, power lines, soiling from dust, debris, and bird droppings, (and also panels' mismatch due to manufacturing tolerance, ageing, etc.) can cause significant power losses in both shaded and non-shaded modules.

Even more, it is commonly reported that, on average, residential and commercial installations are 25% smaller than they could be, because they are designed around shadowing problems and irregular roof shapes.

A solution to this problem might be to use a distributed photovoltaic system architecture. The concept of a distributed photovoltaic system has become possible with the deployment of micro-converters or micro-inverters able to perform MPPT at a photovoltaic module scale (or even a string of photovoltaic modules scale).

However, this association of multiple micro-converters, or micro-inverters, can only solve a part of the problems related to partial shadowing and different tilt or orientation angles of photovoltaic modules.

In addition, the increasing number of micro-converter results in a cost increase of such photovoltaic panels.

U.S. Pat. No. 6,350,944 relates to a solar module with reconfigurable tile.

This document describes a reconfigurable solar cell panel having a system of integrated solar-power generation cells with monitoring control and reconfiguration circuitry in a modular array scheme. A plurality of solar cells is packaged on a printed circuit board to form a solar module, also known as a solar module array configurable tile (SMART) module. A solar panel is made up of a plurality of modules that are electrically connected together. The printed circuit board is the physical support structure for the array of solar cells and provides the electrical connection paths between the solar cells comprising the solar cell module. Each solar cell on the module is part of a matrix of solar cells. A plurality of modules is assembled into a solar panel.

However, the solution in this document is cumbersome and expensive as routing as well as switching takes place between the solar cells on the substrate. In addition, not only routing lines for energy flow, but also control lines for controlling the transistors have to be foreseen which will render solar panels more expensive. This document is silent to connection of the solar panel to a converter.

WO2008076301 discloses a photovoltaic module utilizing a flex circuit for reconfiguration.

Even if this document discloses that photovoltaic cells may be connected in series, in parallel or isolated upon the environmental conditions, only one converter is used. Thus reconfiguration and therefore converter capacities are not used in an optimized manner.

WO2009060273 relates to a method of operating and device for controlling an energy installation comprising photovoltaic modules and inverters in which a selection and control unit selects combinations of connections of the photovoltaic modules and controls a switching unit as to establish a selected combination.

Although this document discloses to realize a serial/parallel connection in order to supply to the input of the converters current in their working range, the solution in this document does not allow taking into account efficiently the whole chain from the PV cell to the output of the converters.

The present invention aims at mitigating, at least partially, the drawbacks described above, in particular for enhancing power conversion.

For this purpose, the invention proposes an electronic management system for electricity generating cells, the system comprising:
  cell connection terminals to be connected to n associated electricity generating cells, n being a positive integer number,
  outputs to be connected to m associated static converters; m being a positive integer number and at least m=2,
  an energy routing module adapted for routing energy flows from and between said cell connection terminals towards said outputs; and
  an electronic control unit adapted for controlling dynamically the energy routing module.

Thanks to the dynamical energy routing to the converters, power conversion can be optimized. The electronic management system is versatile to adapt to many different situations. The electronic management system does not interfere with the construction of the electricity generating cells and can be integrated in a simple way in an electricity generating system.

In a particular embodiment, the electronic control unit comprises:
  first sensors within the group comprising voltage and/or current sensors at a cell connection terminal, second sensors comprising a voltage and/or current sensors at outputs of the static converters, and the electronic control unit is arranged to reconfigure dynamically the switches of said energy routing module in function of the output of said first and second sensors.

Thus, in taking into account sensor measurements at cell connection terminals on the one side and the output of the static converters on the other side, the overall chain (cell, energy routing module, converters) can be taken into account. The invention therefore allows optimizing at least one parameter in the group of (i) instant power at the output of the converters or (ii) aging of the converters.

If the parameter is the instant output power of the converters, then optimizing would mean to maximize the instant power output of the converters.

If the parameter is aging of the converters, the optimizing would mean to operate the converters in an operation state that reduces the aging effect, for example by functioning at lower temperature that induces less stress.

As another example, if the output power at cell level has been optimized for the entry of for example one selected converter to figure in his operating range, it might be that during operation, the temperature of the converter rises and the converting efficiency decreases. In this case, the control unit would observe through the detectors at the output of the converter the decrease in power while the power at the cell connection terminals is still the same. The control unit is then programmed to deduce that in that case, the switches of the energy routing module shall be reconfigured dynamically in order to set in service another converter or a second converter in parallel to the first one. The instant power output of the system would re-increase and overall power output is optimized.

According to other characteristics taken alone or in combination:

According to one aspect, m being a positive integer less than n.

This contributes for minimizing the number of used converters and reducing the overall cost of the electricity in particular compared to a fully distributed power conversion system.

According to another aspect, the system comprises at least 2n cell connection terminals and at least 2m outputs.

According to one aspect, the energy routing module comprises an electrical connection map between said cell connection terminals and said outputs and switches disposed in the electrical connection map for routing the energy from and between at least one of said cell connection terminals to at least one of said outputs.

The electrical connection map and the switches may be configured to provide at said outputs several serial and/or parallel connections of said cell connection terminals.

According to one aspect, the switches have low ohmic resistance in conduction state.

Said switches may be electromechanical switches, MOSFET transistors or IGBT switches.

The electronic control unit may be arranged to reconfigure dynamically the switches of said energy routing module upon a change in a control parameter, which control parameter may be at least one parameter of the group of parameters comprising: environmental temperature, irradiance of at least one photovoltaic cell, a converter duty cycle of at least care converter, a failure flag, produced power level.

According to another example, the electronic control unit is arranged to reconfigure dynamically the switches of said energy routing module on a periodically basis.

According to a further example, the electronic control unit may be arranged to reconfigure dynamically the switches of said energy routing module upon an estimated optimal power output based on past energy routing configurations.

Furthermore, the electronic control unit may be arranged to reconfigure the switches of said energy routing dynamically module upon the optimisation of a power cost function.

The electronic control unit may be configured to alternate period of operation of said outputs.

According to another embodiment the energy routing module comprises furthermore at least p supplementary outputs, p being a positive integer number and p≥1, connected to correspondent p supplementary input terminals of said energy routing module forming a loop connection between said p outputs and said p input terminals.

At least one of said loop connections may comprise a static converter.

The invention concerns also an electricity generating system comprising:

at least n electricity generating cells, n being a positive integer number, at least m static converters; m being a positive integer number and at least m=2, and an electronic management system as described above, the electronic management system comprising:

cell connection terminals connected to n associated electricity generating cells, outputs connected to m associated static converters;

an energy routing module adapted for routing energy flows from and between said cell connection terminals towards said outputs; and an electronic control unit adapted for controlling dynamically the energy routing module.

In a particular embodiment, the electronic control unit comprises:

first sensors within the group comprising voltage and/or current sensors at a cell connection terminal, second sensors comprising a voltage and/or current sensors at outputs of the static converters, and the electronic control unit is arranged to reconfigure dynamically the switches of said energy routing module in function of the output of said first and second sensors.

In some embodiments m may be less than n.

The electricity generating cells may be photovoltaic cells, photovoltaic strings comprising several photovoltaic cells, or electrochemical cells or fuel cells.

According to one aspect, said converters comprise an MPPT control unit.

Said m static converters may be divided in at least two groups of converters exhibiting different power ranges and/or conversion technology.

The invention also concerns a method for electronically managing energy flow between at least n electricity generating cells, n being a positive integer number, and at least m static converters; m being a positive integer number and at least m=2, comprising the step of dynamically routing energy flows from and between cell connection terminals connected to the electricity generating cells towards said outputs.

In a particular embodiment, the method further comprises the steps of:

detecting eel values comprising voltage and/or current values of the cell connection terminals, detecting converter values comprising voltage and/or current values of outputs of the static converters, dynamically routing energy flows from and between cell connection terminals connected to the electricity generating cells towards said outputs, at least some outputs being connected to said at least m static converters in function of the cell values and of the converter values.

According to one aspect m may be less than n.

According to one aspect the method comprises the following steps:
  detection of operation state of converters between working converters and non-working converters because of a failure;
  dynamically routing energy flows from and between 2n cell connection terminals connected to the electricity generating cells towards said working converters.

In an embodiment, the detection of operating state of converters is based on a detection of converter values comprising voltage and/or current values of outputs of the static converters.

According to another aspect where said electricity generating cells are photovoltaic cells, the method may comprise the following steps:
  detection of irradiance state of PV cells between at least two classes of irradiance states in particular shaded PV cells and non-shaded PV-cells;
  dynamically routing energy flows from and between cell connection terminals connected to the electricity generating cells towards said converters in connecting only PV cells of same class of irradiance state in series to a converter.

According to another aspect the period of operation of said outputs is alternated in a rotating manner to equalize the operation time and/or the energy processed by each converter.

BRIEF DESCRIPTIONS OF THE DRAWINGS

Other advantages and characteristics will appear with the reading of the description of the following figures, among which.

DETAILED DESCRIPTION

On all the figures the same references refer to the same elements.

Figure 1:
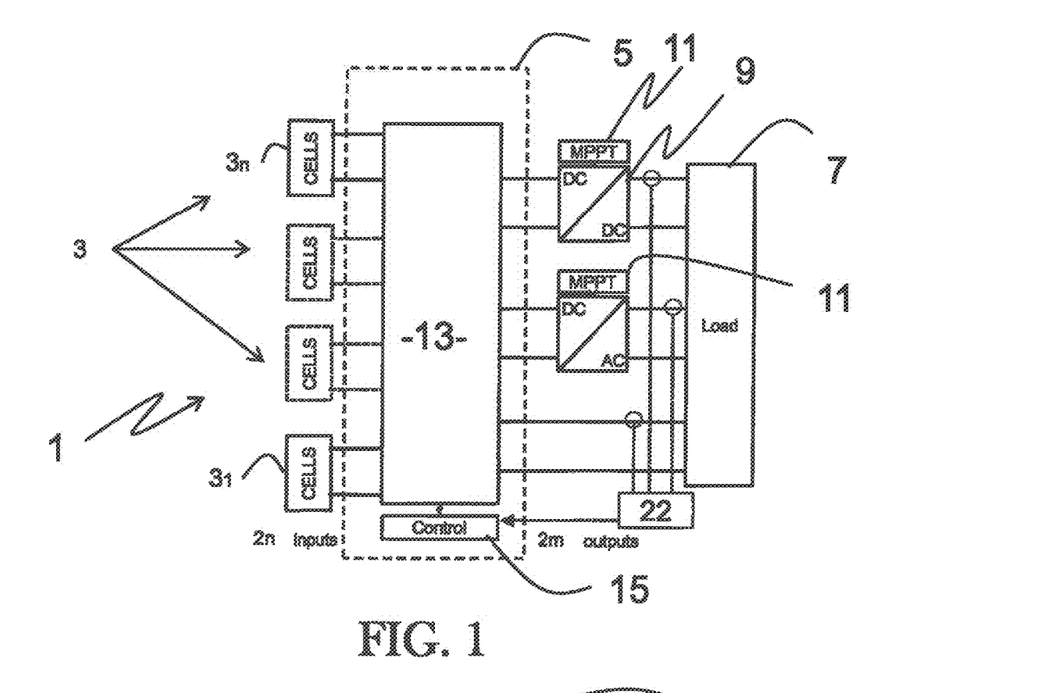
FIG. 1 shows an example of an electricity generating system with an electronic management system according to the invention.

FIG. 1 schematically illustrates an electricity generating system 1 comprising electricity generating cells 3 ($3_1$, $3_2$, $3_3$, . . . $3_n$; n being a positive integer).

Such electricity generating cells 3 may be photovoltaic cells (PV cells), photovoltaic strings comprising several PV cells, electrochemical cells, fuel cells or any part of a modular electricity generator.

The following description focuses more specifically on PV cells and PV strings, but does not exclude other sources of renewable electric energy or electrical storage devices.

In the case of inorganic materials, a photovoltaic cell essentially consists of a diode (pin or pn junction) made up from a semiconductor material. This material has the property of absorbing light energy, a significant portion of which may be transferred to charge carriers (electrons and holes). With the structure of a diode (pin or pn junction)—with doping of two areas of type N and of type P respectively—optionally separated by a non-doped region (called an "intrinsic" region and designated by "i" in the pin junction)—it is possible to separate the charge carriers in order to then collect them via electrodes which the photovoltaic cell includes. The potential difference (open-circuit voltage, Voc and the maximum current (short-circuit current Isc) which may be provided by the photovoltaic cell depend both on the constitutive materials of the assembly of the cell and on the conditions surrounding this cell (including illumination through spectral intensity, temperature . . . ).

In the case of organic materials, the models are substantially different—making further reference to the notion of donor and acceptor materials in which electron-hole pairs called excitons are created. The final purpose remains the same: separate the charge carriers for collecting and generating a current.

As shown on FIG. 1, the electricity generating cells 3 are connected to an electronic management system 5. The electronic management system 5 is connected either directly to a load 7, or indirectly via static converters 9.

The load 7 may be a direct consumer, a storage system, or an electrical grid/network.

In the present example, static converters 9 are DC-DC converters, but DC/AC converters may also be used instead dependent on the load 7.

Each converter is associated with an MPPT control unit 11 for tracking the maximum power point (or MPPT i.e. Maximum Power Point Tracker) for collecting the electric energy produced by the PV cells 3 in order to deliver it to the load 7.

Depending on the needs of the load 7, the converters 9 may be led to increasing or lowering the output voltage and/or to rippling the output voltage.

The MPPT control units 11 are designed in order to control the converters 9 in order to obtain an input voltage which corresponds to an optimum voltage value Vopt i.e. corresponding to a maximum point of the power characteristic.

The maximum power point depends on several variable parameters over time, notably on the sunlight present, on the temperature of the PV cells or on the number of PV cells in an operating state as it will be discussed later on.

In this way, the yields of the PV cells are not affected too much by the malfunction or the shadowing of certain cells.

For example, the maximum power point tracker MPPT control may apply an algorithm which identifies the influence of a voltage change on the power delivered at its input by the PV cells 3 through the electronic management system 5 and causes a shift in the voltage in the direction identified as increasing the power.

Thus, such an algorithm consists of measuring the power delivered by the converter 9 for a first voltage and, after a certain time, of imposing a second voltage greater than the first and then measuring or estimating the corresponding power.

In the case when the power corresponding to the second voltage is greater than the power corresponding to the first voltage, the following step of the algorithm is to impose an even greater third voltage. In the opposite case, the third applied voltage is lower than the first voltage. Thus, gradually the system may permanently adapt the voltage to the input terminals of the converters 9 in order to approach the maximum power point as closely as possible. It is understood that other algorithms may be applied for the MPPT control.

More specifically, the electronic management system 5 comprises an energy routing module 13 and an electronic control unit 15 controlling the energy routing module 13.

As can be seen on FIG. 1, each PV cell 3 has two terminals connected to two corresponding cell connection terminals of the energy routing module 13.

In a not represented alternative, it is possible that two PV cells share a common cell connection terminal of the energy routing module 13.

Thus, in the present embodiment 2n cell connection terminals of the energy routing module 13 are connected to n associated electricity generating cells 3.

The energy routing module 13 has outputs to be connected to associated static converters 9 or directly to load 7. In the present case the routing module has 2m outputs m being a positive integer number.

However, it is possible to have for example an impair number of outputs. This can be interesting when using a multi-level converter.

In the present case m is less than n and at least m=2, which allows a lower number of static converters But in other embodiments, one may consider m equal or higher than n without losing the benefit of the present invention.

The energy routing module 13 is adapted for routing energy flows from and between its cell connection terminals towards its outputs.

The energy routing module 13 is controlled by the electronic control unit 15 which is adapted for controlling dynamically the energy routing module 13.

"Dynamically" means that the control unit 15 will consider from time to time the status of the energy routing module 13 and may apply control commands that will change of the status of the energy routing module 13. Thus, the electronic control unit controls as an on-going process, on a continuous basis the energy routing module 13 for optimizing the energy flow from the electricity generating cells to the static converters.

Figure 3:
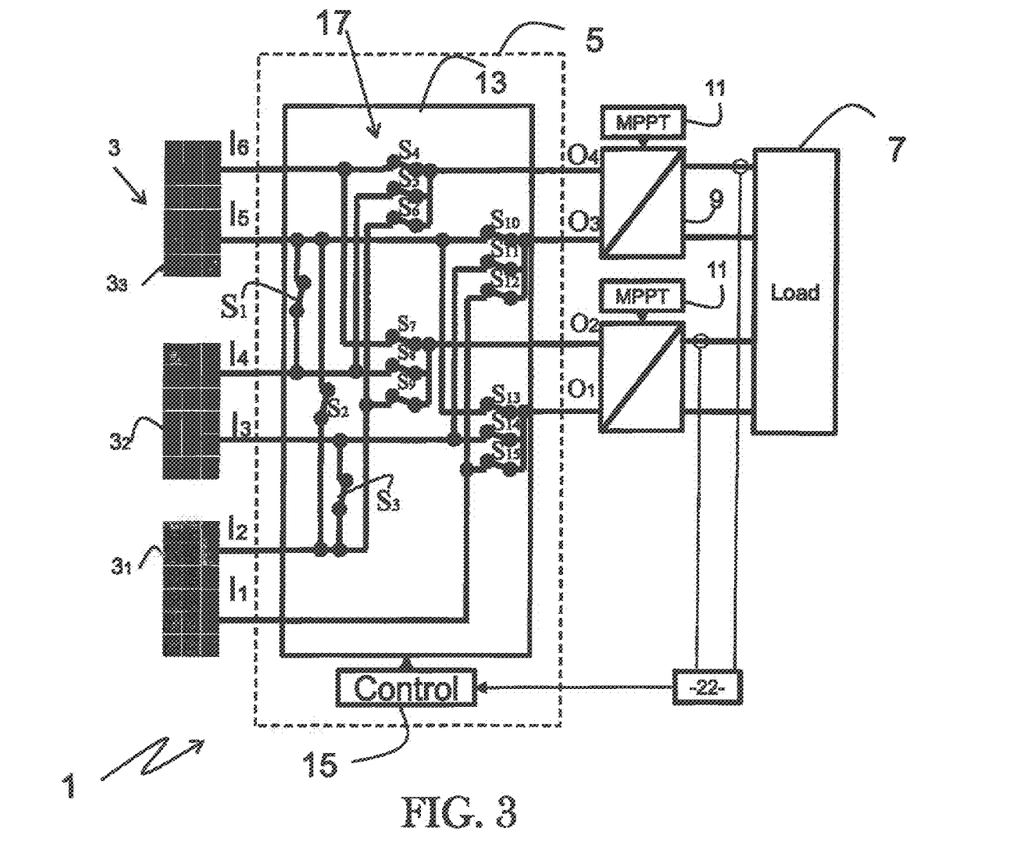
FIG. 3 shows an example of an electricity generating system with an electronic management system with three PV cells and two converters.

A specific, but non-limiting example of an energy routing module 13 is shown in FIG. 3 which exhibits an example of an electricity generating system 1 with an electronic management system 5 with three PV cells 3 ($3_1$, $3_2$, $3_3$) and two static converters 9 ($9_1$, $9_2$).

In this example, the energy routing module 13 has six cell connection terminals ($I_k$, k being a positive integer; $1 \leq k \leq 6$) and four outputs ($O_1$, l being a positive integer; $1 \leq l \leq 4$).

As can be seen, the energy routing module 13 comprises an electrical connection map 17 between said cell connection terminals and said outputs allowing that each cell connection terminal $I_k$ may be connected through electrical connections to each output $O_1$, but also that a cell connection terminal $I_k$ may be connected to another cell connection terminal $I_j$, j being an integer $j \neq k$.

Therefore a cell connection terminal of the energy routing module 13 may be considered as an input if energy/current is flowing from a PV cell 3 into the energy routing module and may be considered as an output if energy/current is flowing from the energy routing module to a PV cell 3. The latter will be the case when for example two PV cells are put in series connection.

It can be understood that in other examples less combinations may be envisaged, leading therefore to the fact that a cell connection terminal may not be connected to all other cell connection terminals or outputs of the energy routing module 13.

Furthermore, the energy routing module comprises switches S (fifteen switches ($S_p$, p being an positive integer; $1 \leq p \leq 15$) disposed in the electrical connection map 17 for routing the energy from or between at least one of said cell connection terminals $I_k$ to at least one of said outputs $O_1$.

For example if switch $S_{15}$ is closed, input $I_1$ is connected to output $O_1$.

However, when switch $S_{15}$ is closed, $S_{13}$ and $S_{14}$ open, $S_8$ closed, $S_7$ and $S_9$ open and $S_3$ closed, PV cell $3_1$ and $3_2$ are put in series connection on outputs $O_1$ and $O_2$ to the static converter $9_1$.

Therefore the electrical connection map 17 and said switches S are configured to provide at said outputs several serial and/or parallel connections of said cell connection terminals of the energy routing module 13.

The switches S have low ohmic resistance in conduction state, for example less than 10 mΩ.

The switches S may be electromechanical switches, MOSFET transistors or IGBT switches.

Figure 2:
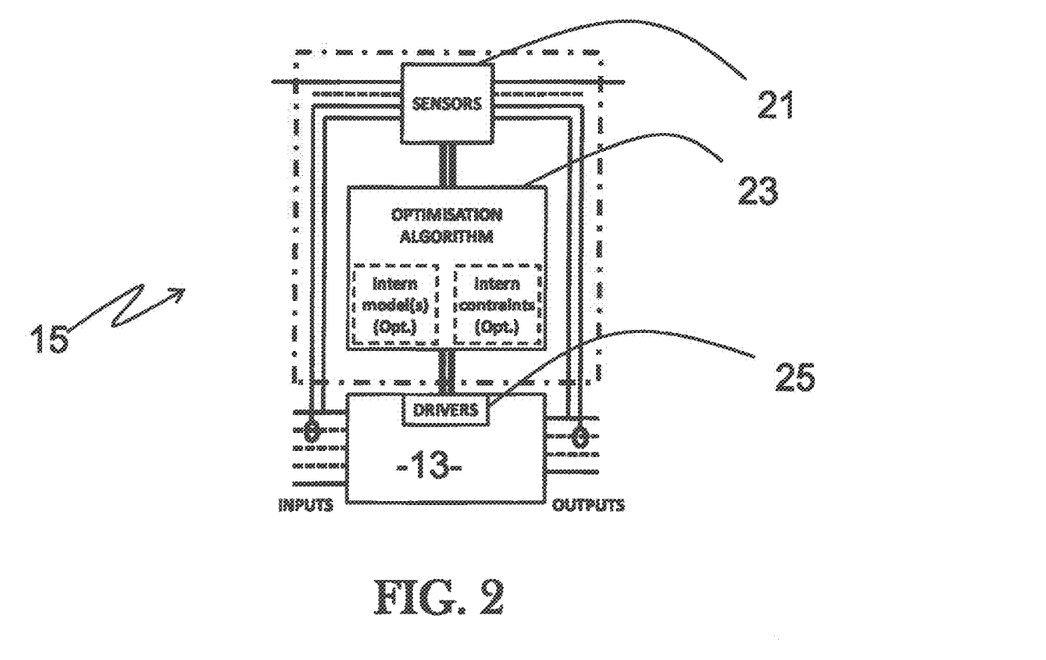
FIG. 2 shows an example of an electronic control unit of the electronic management system of FIG. 1.

Turning now to FIG. 2 showing more in detail an example of an electronic control unit 15. The electronic control unit 15 comprises at least first sensors 21 like voltage and/or current sensors at the cell connection terminals of said energy routing module 13 for detecting cell values meaning for example voltage and/or current values of the cell connection terminals.

Worthless to say that there may be several sensors 21 measuring different parameters as mentioned as example here above.

The electronic control unit 15 may further comprise second sensors 22 comprising voltage and/or current sensors at the outputs of the static converters 9 for detecting converter values meaning for example voltage and/or current values of outputs of the static converters.

In this embodiment, the electronic control unit 15 is arranged to reconfigure dynamically the switches S of said energy routing module 13 in function of the cell values and of the converter values, for example in order to maximise instant power output.

Thanks to first 21 and second 22 sensors, the generated energy is optimized routed to static converters 9 and a maximized power output can be achieved at the output of the energy generating system 1.

For example in comparing the generated power at the cells and the power output at the converters, aging of the converters and changing in their characteristics can be taken into account.

Another possible aspect might also be a loss of power conversion efficiency at static converter lever 9, in case of temperature increase. In this case, the control unit 15 detects for example a stable power output at cell level while at the same time a power output decrease at static converter output. Then the control unit 15 is configured to set on operation another static converter 9, for example in parallel to the first one or instead of.

Configuration or reconfiguration of a switch S means to control the switching state or position (passing state/blocking state) of a switch S of said energy routing module 13.

The electronic control unit 15 furthermore comprises a processing unit 23 such as a microprocessor comprising a memory and a software program installed thereon, and a driving unit 25 for driving said switches S upon instructions received from the microprocessor.

The electronic control unit 15 is arranged to reconfigure dynamically the position of the switches S of said energy routing module 13 upon a change in a control parameter. This is typically implemented through the software and an adapted optimisation algorithm.

The parameter that may trigger the reconfiguration of the switch positions may be, among other examples, the environmental temperature, irradiance of at least one photovoltaic cell, a converter duty cycle of at least one converter, any failure flag, the overall level of produced power. This allows taking into account for example shadowing effect on at least one cell 3.

According to an alternative, the electronic control unit 15 with its processing unit 23 is arranged to reconfigure dynamically the switches S of said energy routing module on a periodically basis, for example every 5 minutes.

This aims to regular update the switching configuration in order to optimize power output.

According to another alternative the electronic control unit 15 is arranged to reconfigure the switches of said energy routing module 13 upon an estimated optimal power output based on past energy routing configurations. In this case, the electronic control unit 15 safeguards past switching configurations related to, for example, measured values of at least one sensor 21 and/or environmental conditions and/or delivered output power in an internal memory or database or evolving model in order to forecast optimum switching configurations for future situations.

According to another alternative, a power cost function software is implemented in the processing unit 23 and the electronic control unit 15 is arranged to reconfigure the switches of said energy routing module upon such a power cost function routine.

According to another alternative, the electronic control unit 15 is configured to alternate period of operation of said outputs and therefore the operation time of the static converters 9, for example in a rotating process. This aims to smooth and equalize the operation time of the static converters 9, in particular to increase lifetime of such converters.

It is therefore easily understandable that the present solution allows reconfiguring dynamically the switching between the electricity generating cells, allowing therefore adapting at best to the current and/or voltage at the output of the energy routing module 13 to the inputs of the converters 9, allowing thus to achieve best operation conditions for the converters 9.

Such dynamic reconfiguration is achieved by implementing for example to software a method for electronically managing energy flow between at least n electricity generating cells 3, and at least m static converters 9, at least m=2, comprising the step of dynamically routing energy flows from and between cell connection terminals connected to the electricity generating cells towards said outputs.

Therefore, in an electricity generating system 1, the number of converters can be reduced and optimized in order to allow responding to shadowing effects while avoiding associating one converter to one electricity generating cell 3 like in fully distributed architectures. Thanks to the above described electronic management system 5, it is even possible and envisaged that the m static converters 9 are divided in at least two groups of converters 9 exhibiting for example different power ranges (using or not the same power conversion technology). Thus the converters of one group are different from the converters of the other groups and therefore dedicated to specific/specialized uses.

This means that for example in FIG. 3 that one of fee converters 9 may have for example half of the nominal power of the other converter 9 allowing also some supplemental cost reduction and increase in performance.

Another example could be in pooling several specialized converters. For instance with a pool of DC/DC converters, some can be buck only (specifically reducing the voltage), others can be boost only (specifically increasing the voltage), and other can be buck/boost (able to increase or decrease the voltage), leading again to some supplemental cost reduction and increase in performance.

Furthermore, the above described electronic management system 5 renders an electricity generating system 1 more robust because in case of failure of one of the converters 9, the rerouting of the energy from the cells 3 to the working converters 9 can maintain power output, even without any loss.

Indeed, the optimisation algorithm implemented in the processing unit 23 may comprise a method where the operation state of the converters 9 is detected between working converters and non-working converters because of a failure or dysfunction, and in response to such failure detection.

Then, the optimization algorithm dynamically drives the switches S of the energy routing modules 13 for routing energy flows from and between 2n cell connection terminals connected to the electricity generating cells 3 towards the converters 9 that are in a working operation state. Thus no power generated by the cells 3 may be lost.

FIG. 4A-4L are simplified views of FIG. 3 and show examples of possible switching configurations of the energy routing module 13 allowing better understanding of the present invention. In these figures, a cloud on one PV cell 3 means that such a cell is affected by a shadowing effect.

Figure 4A:
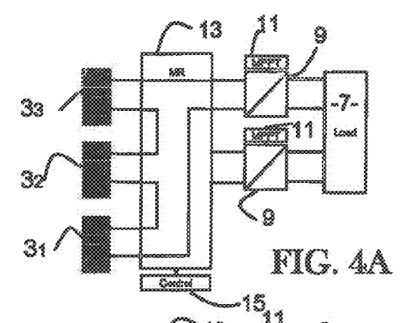
FIGS. 4A to 4L show examples of configuration of the electronic management system of FIG. 3.
Figure 4B:
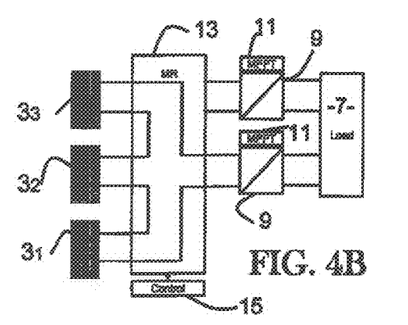

In FIGS. 4A and 4B, all PV cells 3 are connected in series, but only one static converter 9 is used in either of both configurations.

Figure 4C:
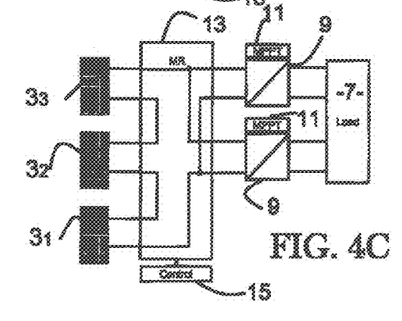

In FIG. 4C, all PV cells 3 are connected in series and both converter 9 are used in parallel.

Figure 4D:
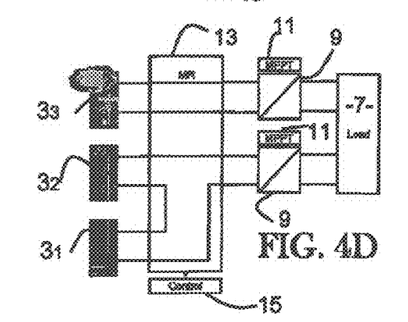
Figure 4E:
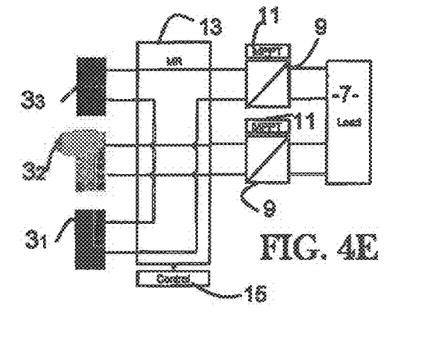
Figure 4F:
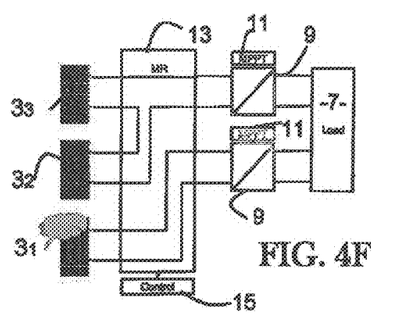

In FIGS. 4D, 4E and 4F, a shadow affects one ($3_3$ in FIG. 4D; $3_2$ in FIG. 4E; $3_1$ in FIG. 4F) of the three PV cells 3. The PV cell 3 affected by the shadow is isolated and connected to one converter 9 whereas the other non-affected PV cells 3 are connected in series to the other converter 9, assuring therefore optimal power harvesting.

Figure 4G:
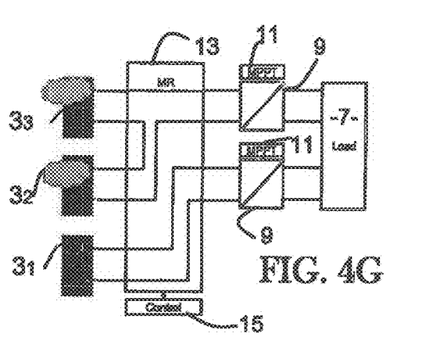
Figure 4H:
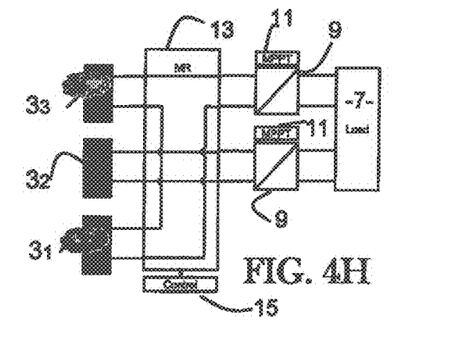
Figure 4I:
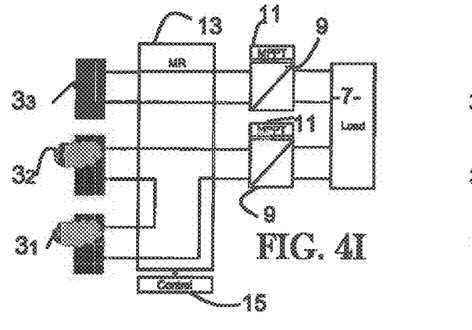

In FIGS. 4G, 4H and 4I, a shadow affects two of the three PV cells 3. The PV cell 3 not affected by the shadow is isolated and connected to one converter 9 whereas the other affected PV cells 3 are connected in series to the other converter 9. Such a configuration is either more efficient in this situation of irradiance.

More generally speaking, the optimisation algorithm implemented in the processing unit 23 may comprise a method where the irradiation state of the PV cells 3, is detected, in particular between shaded and non-shaded cells or other classes of irradiance states.

Then, the optimization algorithm dynamically drives the switches S of the energy routing modules 13 for routing energy flows from and between 2n cell connection terminals connected to the electricity generating cells 3 towards the converters 9 in connecting only PC cells 3 of same irradiance state or belonging to the same class of irradiance state in series to a converter 9.

Figure 4J:
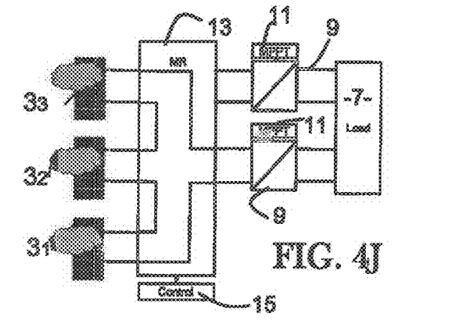
Figure 4K:
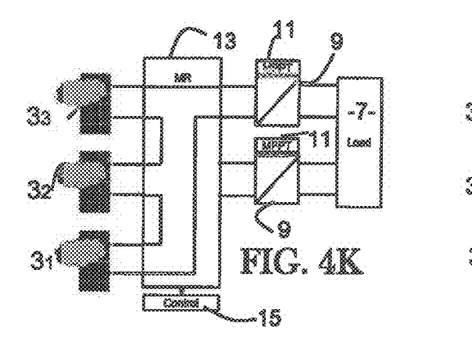
Figure 4L:
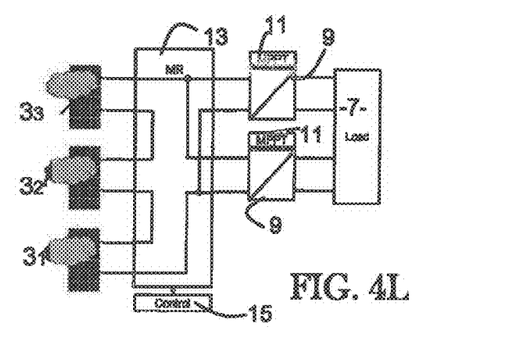

In FIGS. 4J, 4K and 4L, a shadow affects all of the three PV cells 3.

In FIGS. 4J and 4K, all PV cells 3 are connected in series, but only one static converter 9 is used in either of both configurations.

In FIG. 4L, all PV cells 3 are connected in series and both converter 9 are used in parallel.

During functioning, the control unit 15 drives for example in the morning, when sun power is not yet at maximum on a periodically basis (for example every 5 minutes) between configurations shown in FIGS. 4A and 4B. When the sun rises, the control unit 15 detects rising up of irradiance by a sensor 21, and drives the energy routing module 15 to the configuration shown in FIG. 4C.

Let's assume that a cloud will successively shadow one of the PV cells $3_1$, $3_2$, $3_3$, which would be detected by the control unit 15 and its sensors 21. In this case, the control unit 15 drives the energy routing module 13 successively to the configurations shown in FIGS. 4F, 4E, 4D . . . etc.

One understand thus easily the benefit of the energy management system 5 which allows to supply an optimal voltage/currents range to the inputs of the converters 9 in function of the real power generating conditions of the electricity generating cells 3.

FIG. 5-10 show specific examples of electricity generating system 1.

Figure 5:
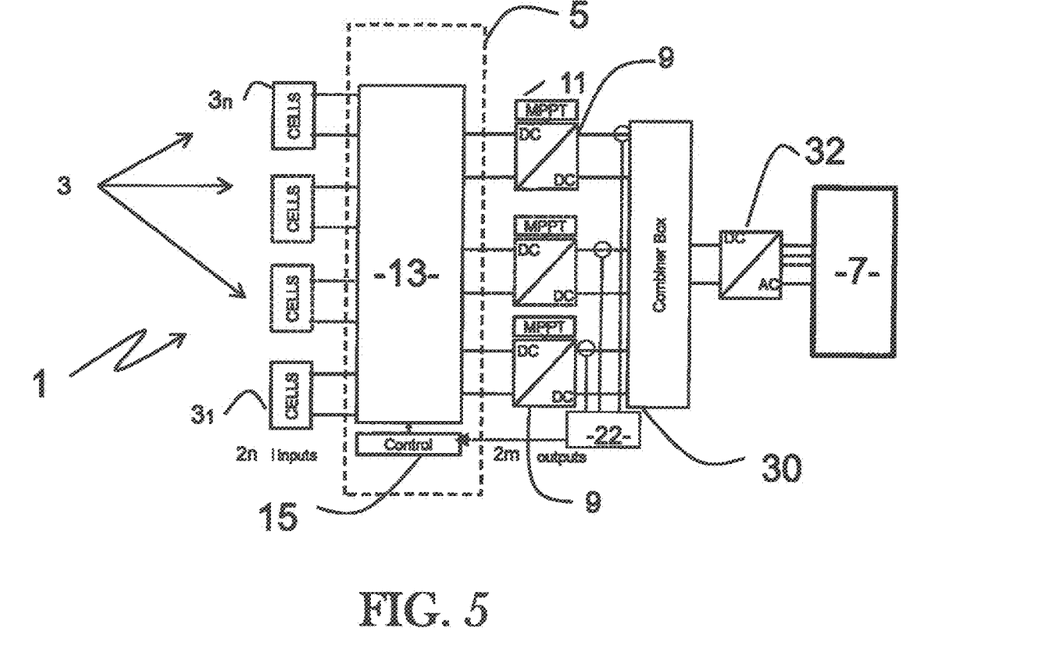
FIG. 5 shows a possible embodiment of an electronic management system for a DC distributed PV system.

FIG. 5 relates to a DC distributed PV system with n PV cells, m DC/DC converters 9 having each an associated MPPT control unit 11. The outputs of the DC/DC converters 9 are connected to a combiner box 30 which output is connected to a DC/AC converter 32. Fixed serial or parallel connections of the converters 9 can be considered in the combiner box 30. The outputs of the DC/AC converter 32 are connected to load 7.

Figure 6:
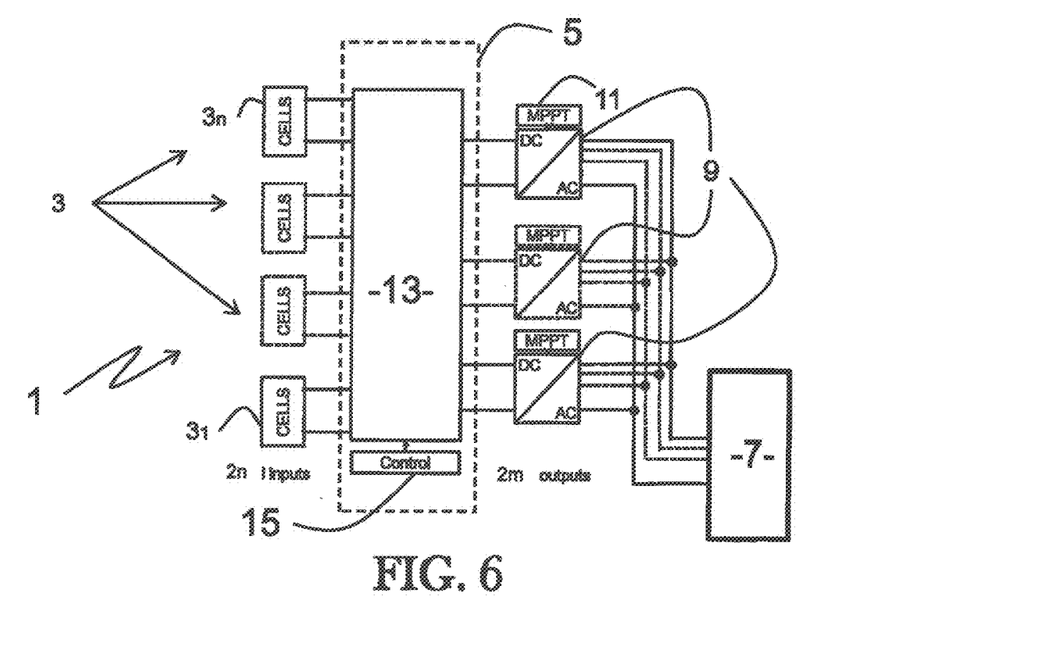
FIG. 6 shows a possible embodiment of an electronic management system for a AC distributed PV system.

FIG. 6 relates to an AC distributed PV system with n PV cells, m DC/AC converters 9 having each an associated MPPT control unit 11. The outputs of the DC/AC converters 9 are connected through common output lines to load 7.

Figure 7:
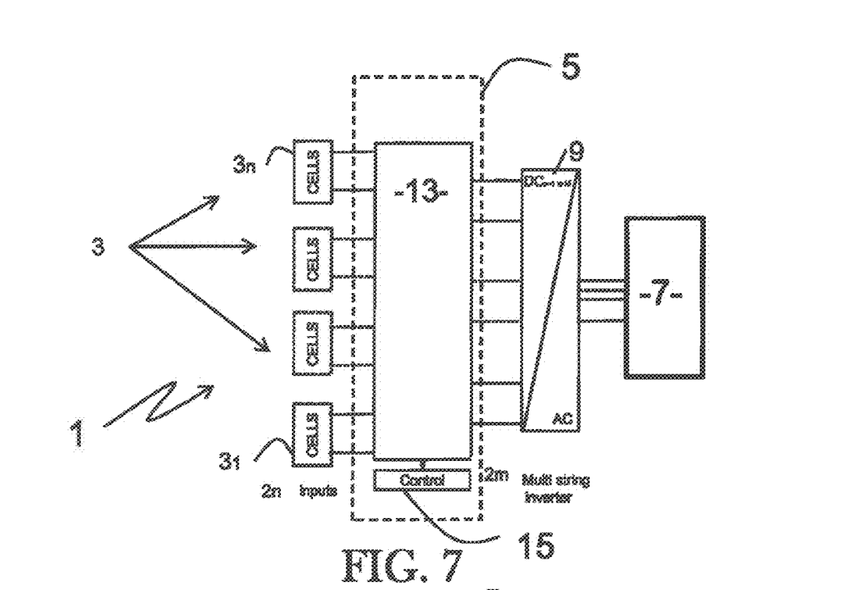
FIG. 7 shows an embodiment of an electronic management system with a multi-string converter.

FIG. 7 relates to a PV system with n PV cells where the m outputs of the energy routing module 13 are connected to the correspondent inputs of a DC/AC multistring converter 9 which outputs are connected to load 7.

Figure 8:
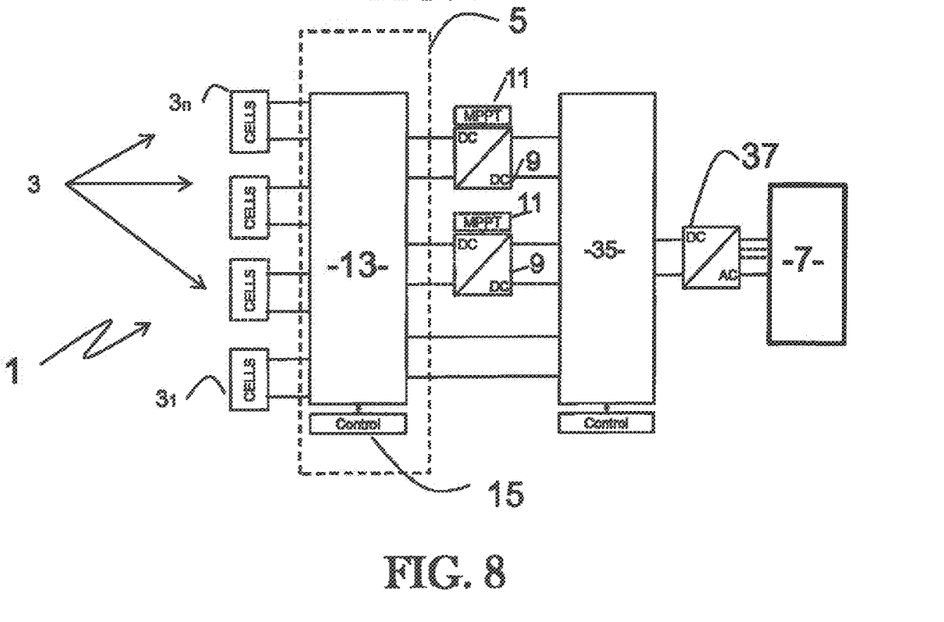
FIG. 8 shows an embodiment of an electricity generating system with an electronic management system according to the invention and a reconfiguration module connected between the converters and an output converter.

FIG. 8 relates to a system with n PV cells, m DC/DC converters 9 having each an associated MPPT control unit 11. The outputs of the DC/DC converters 9 are connected to a reconfiguration module 35 as described in WO2010/070621 in the name of the applicant, the output of the reconfiguration module being connected to an output DC/AC converter 37 which is connected to load 7.

Dynamically reconfigurable serial and/or parallel connections of the converters 9 outputs are considered with the reconfiguration module 35, leading to an increased reliability in case of a DC/DC converter 9 fault. For instance, considering maintenance free system applications (embedded system, remote or inaccessible system . . . ), increased reliability and longer life time can be achieved through redundancy in the conversion stage. One may therefore take advantage of the use of the present invention introducing the electronic routing module 13 between the electricity generating cells 3 and the static converters 9 connected to the output DC/AC converter through a reconfiguration module 35, for example in reducing the base number of converters or micro-converters achieving the same level of reliability using less converters. Furthermore in this case, and as stated here above, the power produced by functional electricity generating cell 3 connected to a defaulting converter 9 is recovered by rerouting the energy flow to the converters 9 that are in a working operation state.

Figure 9:
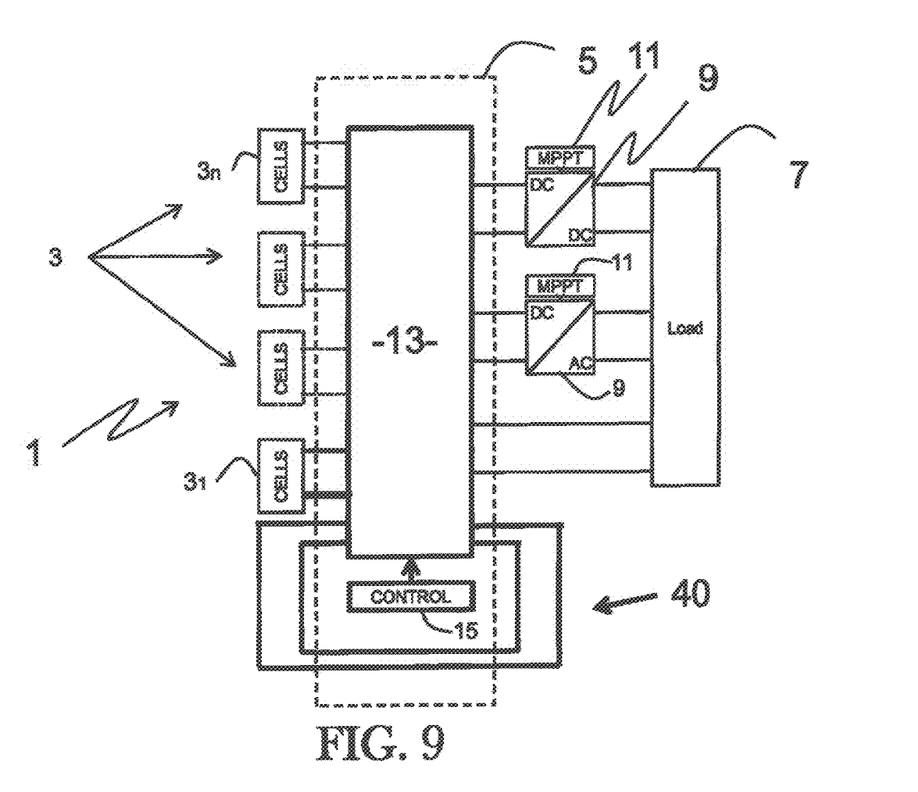
FIG. 9 shows an evolution of an electricity generating system similar to the example of FIG. 3.

FIG. 9 differs from the embodiment shown in FIG. 1 by the fact that the energy routing module 13 comprises furthermore at least 2p outputs, p being a positive integer number and p≥1 (in the present case p=1), connected to correspondent 2p input terminals of the energy routing module 13 forming a loop connection 40 between said 2p outputs and said 2p input terminals.

Internally, the routing module 13 would be similar to the example of the routing module in FIG. 3 and have an electrical connection map 17 having switches disposed therein allowing not only multiple routing of the generated energy from and between the cell connection terminals towards said outputs, but also re-route from an output a said input terminals and from there to other output terminals, while combining for example with generated energy from other cell connection terminals.

This allows increasing the possibilities of combinations of electricity generating cells 3. In particular, this allows to group groups of electricity generating cells 3.

Figure 10:
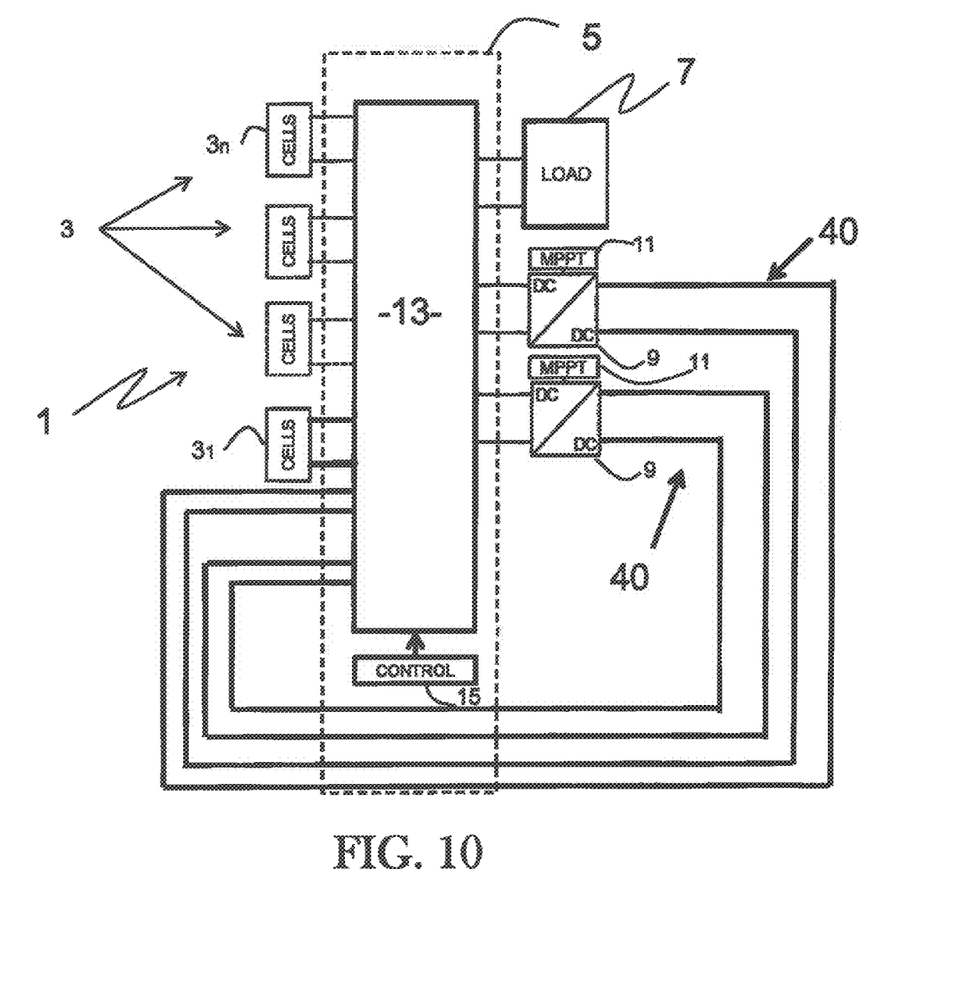
FIG. 10 shows another evolution of an electricity generating system similar to the example of FIG. 3.

The embodiment of FIG. 10 differs from the embodiment of FIG. 1 by the fact that the outputs of static converters 9 are not connected to the load 7 but to correspondent input terminals of the energy routing module 13. In other words, with regards to the embodiment of FIG. 10, the energy routing module 13 comprises two loop connections 40, each comprising a static converter 9 with its MPPT control unit 11.

Thanks to this configuration, the same functioning as described with regard to the embodiment of FIG. 8 may be achieved. In addition, dynamical master-slave configurations can be realized for optimized power conversion.

Figure 11:
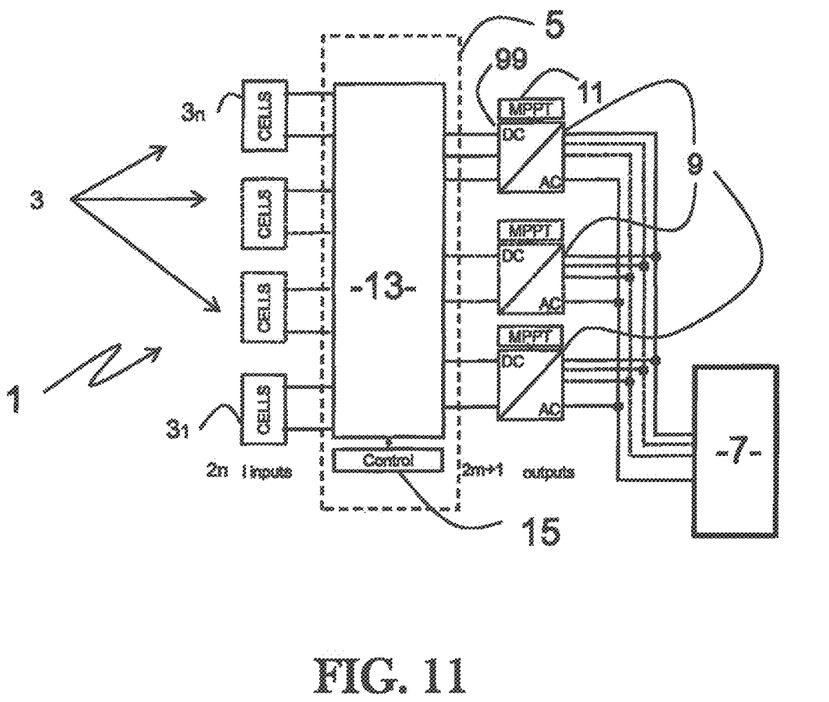
FIG. 11 shows another evolution of an electricity generating system similar to the example of FIG. 6.

The embodiment of FIG. 11 differs from the embodiment of FIG. 6 by the fact that one 99 of static converters 9 is a multi-level converter. Therefore, for converter 99, three outputs of the energy routing module 13 are connected to respective entries of the multi-level converter 99.

An example of a multilevel converter is disclosed in ScienceDirect Solar Energy 84 (2010) 1175-1186 "Direct power control of grid connected PV systems with three level NPC inverter" in particular with respect to FIG. 3 (*b*). Such configuration may be advantageous for direct connection to a grid.

The present invention allows optimizing power harvesting from electricity generating cells 3 through adaptive and dynamic rerouting of the energy/power at the output of the electricity generating cells 3 while decreasing the cost of the system in reducing the necessary number of converters 9 and increasing the reliability of the electricity generating system 1.

In FIGS. 6-11, the second sensors 22 have been omitted voluntary for sake of simplification but these figures could be understood as if these second sensors 22 are present or not.

The invention claimed is:

1. An electronic management system for use with one or more static converters and one or more electricity generating cells, the electronic management system comprising:
   one or more cell connection terminals coupled to corresponding output terminals of n associated electricity generating cells of the electricity generating cells, n being a positive integer number;
   one or more output terminals coupled to corresponding input terminals of m associated static converters of the static converters, m being a positive integer number which is equal to at least two;

an energy routing module having first terminals coupled to corresponding cell connection terminals of the electronic management system, second terminals coupled to corresponding output terminals of the electronic management system, and a third, control terminal, said energy routing module including one or more switches adapted for routing energy flow from at least one of said cell connection terminals to at least one of said output terminals, said energy routing module comprising at least p output terminals and p input terminals, p being a positive integer number which is greater than or equal to one, the output terminals coupled to corresponding input terminals to form one or more loop connections between the p output terminals and the p input terminals; and an electronic control unit coupled to the control terminal of said energy routing module, said electronic control unit configured to dynamically control said energy routing module.

2. The electronic management system according to claim 1, wherein said electronic control unit comprises:

first sensors having inputs coupled to select ones of said cell connection terminals of the electronic management system, the first sensors including at least one of a voltage sensor and a current sensor; and second sensors having inputs coupled to select output terminals of the static converters, the second sensors including at least one of a voltage sensor and a current sensor, wherein said electronic control unit is arranged to dynamically reconfigure the switches of said energy routing module as a function of an output of the first and second sensors.

3. The electronic management system according to claim 1 wherein the electronic control unit is arranged to dynamically reconfigure the switches of said energy routing module in order to optimize at least one parameter in a group of (i) instant power at output terminals of the static converters and (ii) aging of the static converters.

4. The electronic management system according to claim 1 wherein m is a positive integer number which is less than n.

5. The electronic management system according to claim 4 wherein the electronic management system comprises at least 2n cell connection terminals and at least 2m output terminals.

6. The electronic management system according to claim 1 wherein said energy routing module comprises an electrical connection map, the electrical connection map having inputs coupled to the first terminals of said energy routing module and outputs coupled to the second terminals of said energy routing module, wherein the switches of said energy routing module are disposed in the electrical connection map for routing the energy from the at least one cell connection terminal to the at least one output terminal.

7. The electronic management system according to claim 6 wherein the electrical connection map and the switches of said energy routing module are configured to provide serial and/or parallel connections of said cell connection terminals and provide a corresponding output at the second terminals of said energy routing module.

8. The electronic management system according to claim 1 wherein said electronic control unit is arranged to dynamically reconfigure the switches of said energy routing module upon a change in a control parameter.

9. The electronic management system according to claim 1 wherein said electronic control unit is arranged to dynamically reconfigure the switches of said energy routing module on a substantially periodic basis.

10. The electronic management system according to claim 1 wherein said electronic control unit is arranged to dynamically reconfigure the switches of said energy routing module upon an estimated optimal power output based upon past energy routing configurations.

11. The electronic management system according to claim 1 wherein said electronic control unit is arranged to dynamically reconfigure the switches of said energy routing module upon an optimization of a power cost function.

12. The electronic management system according to claim 1 wherein said electronic control unit is configured to alternate periods of operation of said output terminals of the electronic management system.

13. The electronic management system according to claim 1 wherein at least one of the loop connections comprises a static converter.

14. An electricity generating system comprising:

at least n electricity generating cells, n being a positive integer number;

at least m static converters, m being a positive integer number which is equal to at least two; and an electronic management system comprising:

one or more cell connection terminals coupled to corresponding output terminals of n associated electricity generating cells of the electricity generating cells;

one or more output terminals coupled to m associated static converters of the static converters;

an energy routing module having first terminals coupled to corresponding cell connection terminals of the electronic management system, second terminals coupled to corresponding output terminals of the electronic management system, and a third, control terminal, said energy routing module including one or more switches adapted for routing energy flow from at least one of said cell connection terminals to at least one of said output terminals, said energy routing module comprising at least p output terminals and p input terminals, p being a positive integer number which is greater than or equal to one the output terminals coupled to corresponding input terminals to form one or more loop connections between the p output terminals and the p input terminals; and an electronic control unit coupled to the control terminal of said energy routing module, said electronic control unit configured to dynamically control said energy routing module.

15. The electricity generating system according to claim 14 wherein said electronic control unit comprises:

first sensors having inputs coupled to select ones of said cell connection terminals of the electronic management system, the first sensors including at least one of a voltage sensor and a current sensor; and second sensors having inputs coupled to select output terminals of the static converters, the second sensors including at least one of a voltage sensor and a current sensor;

wherein said electronic control unit is arranged to dynamically reconfigure the switches of said energy routing module as a function of an output of the first and second sensors.

16. The electricity generating system according to claim 14 wherein m is a positive integer number which is less than n.

17. The electricity generating system according to claim 14 wherein said m static converters are divided in at least two groups of converters exhibiting different power ranges and/or conversion technology.

18. A method for use in an electronic management system for electronically managing energy flow between at least n electricity generating cells and at least m static converters, the method comprising:
dynamically routing energy flow via an energy routing module comprising at least p output terminals and p input terminals, with p being a positive integer greater than or equal to one, the output terminals coupled to corresponding input terminals to form one or more loop connections between the p output terminals and the p input terminals, the at least n electricity generating cells and the at least m static converters, with m and n being positive integers greater than or equal to two, from at least one cell connection terminals of the electronic management system to at least one output terminals of the electronic management system, wherein at least some output terminals of the electronic management system are coupled to corresponding input terminals of the at least m static converters.

19. The method according to claim 18 wherein dynamically routing energy flow from at least one of the cell connection terminals of the electronic management system to at least one of the output terminals of the electronic management system comprises:
detecting cell values at the cell connection terminals, the cell values including at least one of voltage values and current values;
detecting converter values at output terminals of the static converters, the converter values including at least one of voltage values and current values;
dynamically routing energy flow from at least one of the cell connection terminals of the electronic management system to at least one of the output terminals of the electronic management system, wherein a number of the output terminals of the electronic management system which are coupled to the at least m static converters is a function of the cell values and of the converter values.

20. The method according to claim 18 wherein dynamically routing energy flow from at least one of the cell connection terminals of the electronic management system to at least one of the output terminals of the electronic management system comprises:
dynamically routing energy flow from at least one of the cell connection terminals of the electronic management system to at least one of the output terminals of the electronic management system, wherein at least some of the output terminals of the electronic management system are coupled to the at least m static converters, wherein m is less than n.

21. The method according to claim 18 wherein dynamically routing energy flow from at least one of the cell connection terminals of the electronic management system to at least one of the output terminals of the electronic management system comprises:
detecting an operating state of the static converters;
determining whether the static converters are working converters or non-working converters based upon the operation state;
dynamically routing energy flow from the cell connection terminals to the output terminals of the electronic management system which are coupled to corresponding input terminals of the working converters.

22. The method according to claim 21 wherein detecting an operating state of the static converters comprises:
detecting an operating state of static converters based on a detection of converter values comprising voltage and/or current values of outputs of the static converters.

23. The method according to claim 18 wherein dynamically routing energy flow from at least one of the cell connection terminals of the electronic management system to at least one of the output terminals of the electronic management system comprises:
detecting an irradiance state of the electricity generating cells with the electricity generated cells provided as photovoltaic (PV) cells, the irradiance state selected from at least two classes of irradiance states including shaded PV cells and non-shaded PV cells;
dynamically routing energy flow from cell connection terminals of the electronic management system which are coupled to PV cells of a same irradiance state in series to the output terminals of the electronic management system which are coupled to corresponding input terminals of the static converters.

24. The method according to claim 18 wherein dynamically routing energy flow from at least one of the cell connection terminals of the electronic management system to at least one of the output terminals of the electronic management system comprises:
dynamically routing energy flow from at least one of the cell connection terminals of the electronic management system to at least one of the output terminals of the electronic management system, wherein at least some of the output terminals of the electronic management system are coupled to the at least m static converters, and a period of operation of the output terminals of the electronic management system is alternated in a rotating manner to equalize operation time and/or energy processed by each of the static converters.

* * * * *